(12) United States Patent
Kim et al.

(10) Patent No.: US 6,856,076 B2
(45) Date of Patent: Feb. 15, 2005

(54) PLASMA DISPLAY DEVICE HAVING EFFICIENT HEAT CONDUCTIVITY

(75) Inventors: Ki-Jung Kim, Ahsan (KR); Ki-Yun Joung, Cheonan (KR); Tae-Kyoung Kang, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/234,357

(22) Filed: Sep. 3, 2002

(65) Prior Publication Data

US 2003/0071551 A1 Apr. 17, 2003

(30) Foreign Application Priority Data

Oct. 15, 2001 (KR) .......................................... 2001-63451

(51) Int. Cl.[7] .............................. H01J 1/02; H01J 61/52; H01J 7/24; H01J 17/20; H01K 1/58
(52) U.S. Cl. ..................... 313/46; 313/573; 313/582; 313/493; 257/705; 257/710; 257/720; 439/91; 361/705
(58) Field of Search ......................... 313/46, 573, 493, 313/582; 439/91; 257/710, 720

(56) References Cited

U.S. PATENT DOCUMENTS

| | | | | |
|---|---|---|---|---|
| 5,831,374 A | * | 11/1998 | Morita et al. ................. | 313/46 |
| 5,971,566 A | * | 10/1999 | Tani et al. .................... | 362/294 |
| 6,060,166 A | * | 5/2000 | Hoover et al. ............... | 428/408 |
| 6,284,817 B1 | * | 9/2001 | Cross et al. ................. | 523/220 |

FOREIGN PATENT DOCUMENTS

| | | |
|---|---|---|
| JP | 10-40823 | 2/1998 |
| JP | 10-172446 | 6/1998 |
| JP | 10-254372 | 9/1998 |

OTHER PUBLICATIONS

Patent Abstract of Japan, Publication No. 10–040823, Published Feb. 13, 1998, in the name of Tani Yutaka et al.
Patent Abstract of Japan, Publication No. 10–172446, Published Jun. 26, 1998, in the name of Hirano Shigeo et al.

* cited by examiner

Primary Examiner—Joseph Williams
Assistant Examiner—Matt Hodges
(74) Attorney, Agent, or Firm—Christie, Parker and Hale, LLP

(57) ABSTRACT

A plasma display device which improves the adhesion rate of a thermal conductive medium. A chassis base is disposed substantially parallel to a plasma display panel. A thermally conductive medium is disposed between the plasma display panel and the chassis base and is closely adhered to both the plasma display panel and the chassis base. An adhesive pad is interposed between the plasma display panel and the chassis base along the edge of the thermally conductive medium and is adhered to both the plasma display panel and the chassis base. The thermally conductive medium includes a plurality of thermally conductive particles of high thermal conductivity.

12 Claims, 3 Drawing Sheets

PLASMA DISPLAY DEVICE HAVING EFFICIENT HEAT CONDUCTIVITY

CROSS-REFERENCE TO RELATED APPLICATIONS

This application claims priority to and the benefit of Korean Application No. 2001-63451, filed on Oct. 15, 2001 in the Korean Patent Office, the entire disclosure of which is incorporated herein by reference.

FIELD OF THE INVENTION

The present invention relates to a plasma display device and, more particularly, to a plasma display device that has a heat conductive unit for dissipating to the outside heat generated at the plasma display panel.

BACKGROUND OF THE INVENTION

As is well known, a plasma display device realizes an image on a plasma display panel (PDP) by employing plasma generated from gas discharge. Hence, the PDP generates a quantity of heat because of the high-temperature discharge gas.

As a discharge rate of a plasma display device increases to improve brightness, the heat generated at the PDP also increases accordingly. It is therefore a critical factor in the plasma display device to effectively dissipate the heat to the outside for good operation.

For that reason, in a conventional plasma display device, a PDP is usually attached to a chassis base formed out of materials of high thermal conductivity, with a heat-spreading sheet (or a heat-conduction sheet) provided between the PDP and the chassis base so the heat generated at the PDP can be dissipated to the outside via the heat-spreading sheet and the chassis base. The chassis base is typically formed by die-casting or press-working a metallic material such as aluminum. The heat-spreading sheet is typically formed of acryl- or silicone-based resin.

In addition, to improve the efficiency of the heat dissipation of the plasma display device as described above, it is important to effectively mount the heat-spreading sheet. That is, the heat-spreading sheet should be closely attached to both the PDP and the chassis base to improve the efficiency of the heat dissipation.

FIG. 6 is a fragmentary enlarged sectional view showing a plasma display device including a prior means of heat dissipation.

Since chassis base 102 as shown in FIG. 6 is produced by die-casting, the surface thereof that contacts heat-spreading sheet 104 may not be formed sufficiently flat, and it may have a partially curved or raised portion. When heat-spreading sheet 104 is attached to the uneven surface of chassis base 102 as the above, spaces are formed between the contact surfaces of heat spreading sheet 104 and chassis base 102, and air is filled therein to form air gap 108.

If the plasma display device is manufactured with air gap 108 between chassis base 102 and heat-spreading sheet 104, an overall efficiency of heat dissipation decreases, because heat conduction is not performed well enough through air gap 108. Such problems may also occur at the contacting parts of PDP 106 and heat-spreading sheet 104.

To resolve the above problems, when heat-spreading sheet 104 is attached to PDP 106 or chassis base 102, the pressure applied to heat-spreading sheet 104 can be increased to improve the adhesion rate thereof. However, the compression of PDP 106 due to the increased pressure may damage the inner spacers thereof and cause device failure.

Japanese patent publication laid-open No. 10-254372 discloses a plasma display device in which a thermal conduction sheet is provided with recessed sections and projecting sections on the surface contacting a PDP, to prevent the air gap from being formed between the PDP and the thermal conduction sheet. When the thermal conduction sheet is pressed against the PDP, the projecting sections are squeezed and expanded in lateral directions. During the expansion process, the recessed sections become air paths to push out air and are flattened.

The plasma display device described as above might be effective if the surface of the PDP (or the chassis base) contacting the heat-spreading sheet is extremely flat, but it is difficult to practically form the surface to an optimal flatness.

Accordingly, while the pressure applied to the heat-spreading sheet must be increased to improve the adhesion rate in this case, the problems of device failure caused by damaging the spacers still exist.

SUMMARY OF THE INVENTION

In accordance with the present invention, a plasma display device is provided that can improve the adhesion rate of a thermally conductive medium, even though the contact surface of the thermally conductive medium is not optimally flat.

Furthermore, a plasma display device in accordance with the present invention, is provided that can improve the thermal conduction efficiency by improving the adhesion rate of the thermally conductive medium, without increasing the pressure applied against the thermally conductive medium.

The plasma display device includes a plasma display panel; a chassis base disposed substantially parallel to the plasma display panel; a thermally conductive medium which is disposed between the plasma display panel and the chassis base, and which is closely adhered to both the plasma display panel and the chassis base; and an adhesive pad which is interposed between the plasma display panel and the chassis base along the edge of the thermally conductive medium, and which is adhered to both the plasma display panel and the chassis base. The thermally conductive medium includes a plurality of thermally conductive particles of high thermal conductivity.

The thermally conductive particles may vary in diameter, which can contribute to the improvement of the thermal conduction efficiency through decreasing an air gap among the thermally conductive particles and increasing the adhesion rate.

It is preferable that the diameter of the thermally conductive particles is within 0.1–0.3 mm.

In addition, the thermally conductive medium may include a plurality of thermally conductive particles formed in a multi-layered structure. It is preferable that the thermally conductive particle is formed in a two-layered structure having an inner layer and an outer layer. The inner layer of the thermally conductive particle is formed of a rubber material, and the outer layer is formed of a silicone material, which can contribute to the improvement of both the heat conduction and the shock absorption.

DETAILED DESCRIPTION OF THE INVENTION

Figure 1:
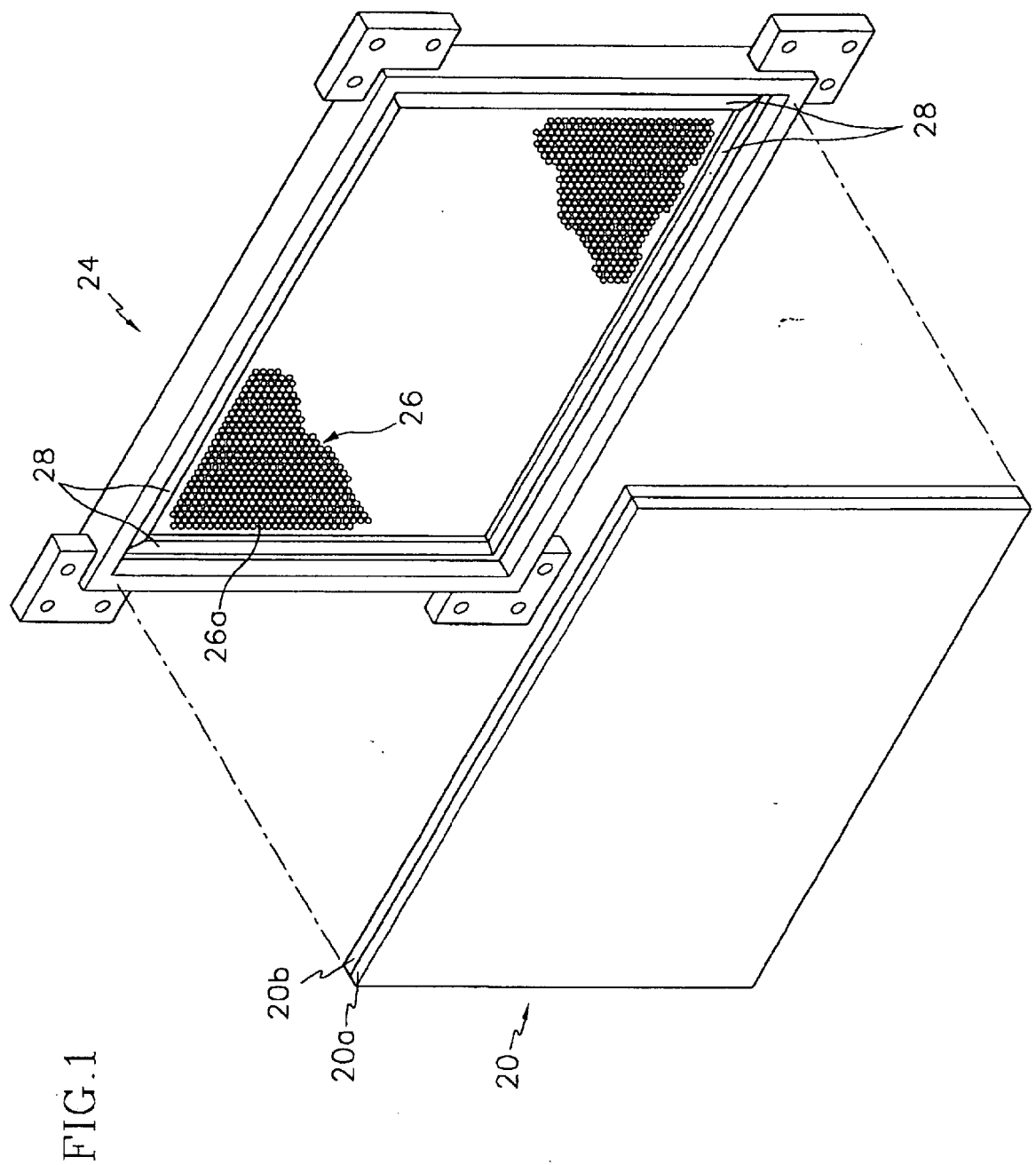
FIG. 1 is an exploded perspective view of a plasma display device having a thermally conductive medium according to a first embodiment of the present invention.
Figure 2:
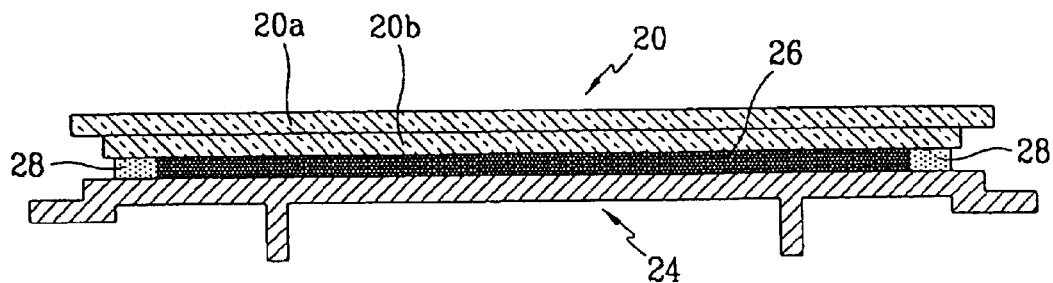
FIG. 2 is a sectional view of a plasma display device having a thermally conductive medium according to a first embodiment of the present invention.

FIG. 1 is an exploded perspective view of a plasma display device having a thermally conductive medium according to a first embodiment of the present invention, and FIG. 2 is a sectional view of a plasma display device having a thermally conductive medium according to a first embodiment of the present invention.

Referring to FIGS. 1 and 2, the plasma display device includes: PDP 20 composed of two glass substrates 20a and 20b to realize an image through plasma from discharged gas, chassis base 24 disposed fixedly on a rear side of PDP 20 opposite to the screen side thereof, and thermally conductive medium 26 interposed between PDP 20 and chassis base 24 to transfer heat generated at PDP 20 to chassis base 24 and dissipate the heat. A front case (not shown) is provided to the side of PDP 20, and a rear case (not shown) is provided to the side of chassis base 24, thereby constructing the plasma display device.

In the above structure, PDP 20 has a rectangular shape with a long side and a short side, and chassis base 24 is formed from a material such as aluminum, which has excellent thermal conductivity. A driving circuit (not shown) is provided on the rear side of chassis base 24, opposite to the side facing the PDP, for driving the plasma display device.

Thermally conductive medium 26, together with chassis base 24, has the role of dissipating to the outside the heat generated at PDP 20 due to the operation of the plasma display device. In order to enhance the efficiency in the adhesion of thermally conductive medium 26 to chassis base 24 or PDP 20, thermally conductive medium 26 has a structure with the following features.

Thermally conductive medium 26 includes a plurality of thermally conductive particles 26a, which are manufactured in the shape of small particles from materials of high thermal conductivity such as silicone-based resin.

Considering that the prior art thermal conduction sheet is formed within about 1–2 mm of thickness for the heat dissipation and shock absorption, the diameter of each thermal conduction particle is preferably within about 0.1–0.3 mm. Particles with a diameter of less than 0.1 mm are difficult to manufacture, while particles with a diameter larger than 0.3 mm may deteriorate the thermal conduction efficiency because of a relatively large air gap between the particles.

Furthermore, thermally conductive medium 26 can include a plurality of thermally conductive particles varying in diameter. When thermally conductive medium 26 includes particles of a large and a small diameter in a predetermined ratio, the thermal conduction efficiency can be improved through minimizing the porosity of thermally conductive medium 26 and increasing the adhesion rate thereof. For example, when the diameter of a larger particle is 3 mm and the diameter of the smaller particle is 1 mm, a predetermined mixing ratio could be 15:8, or even 2:1 (i.e., the ratio of the quantity of larger diameter particles to the quantity of smaller diameter particles).

In the plasma display device of the present invention, thermally conductive medium 26 is interposed between PDP 20 and chassis base 24 and is adhered to both of them, by passing through the following steps.

First, as shown in FIG. 1, an adhesive pad 28 is adhered to the front side of chassis base 24 (the side to which the PDP is attached) along the edge thereof, after estimating the position at which thermally conductive medium 26 is to be located. A double-sided tape of a predetermined thickness can be employed as adhesive pad 28, which is preferably formed in the shape of a rectangular frame adjusted to the size of PDP 20.

After adhesive pad 28 is adhered to chassis base 24, a plurality of thermally conductive particles are filled into the frame formed with adhesive pad 28. Then, PDP 20 is placed on thermally conductive medium 26 including a plurality of thermally conductive particles 26a and it is subjected to pressure.

Figure 3:
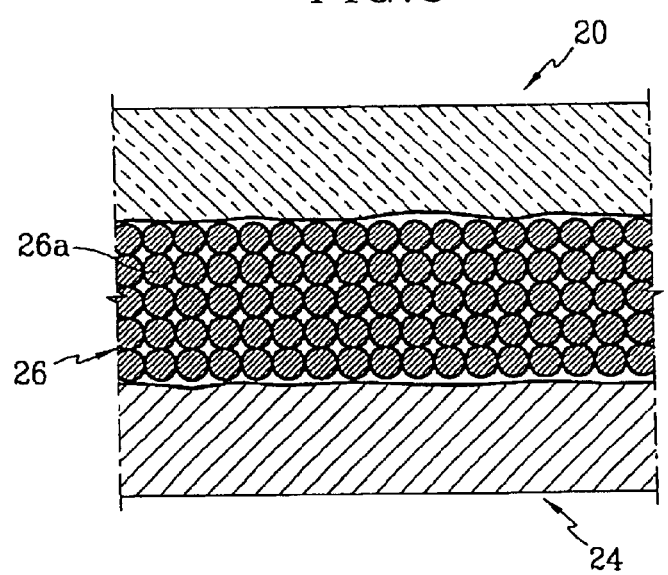
FIG. 3 is a fragmentary enlarged sectional view of a plasma display device having a thermally conductive medium according to a first embodiment of the present invention before pressing.
Figure 4:
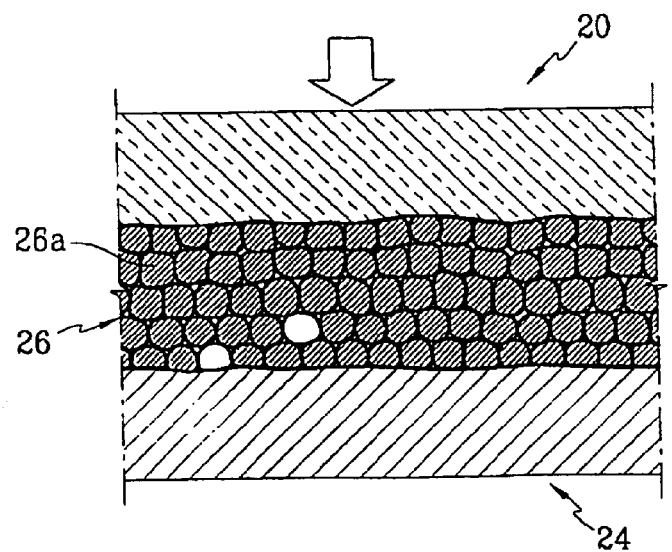
FIG. 4 is a fragmentary enlarged sectional view of a plasma display device having a thermally conductive medium according to a first embodiment of the present invention after pressing.

FIG. 3 is a fragmentary enlarged sectional view of a plasma display device having a thermally conductive medium according to a first embodiment of the present invention before pressing, and FIG. 4 is a fragmentary enlarged sectional view of a plasma display device having a thermally conductive medium according to a first embodiment of the present invention after pressing (as represented by the arrow in FIG. 4).

As shown in FIGS. 3 and 4, although the surface of chassis base 24 which is in contact with thermally conductive medium 26 is unevenly formed due to manufacturing conditions as described above, thermally conductive particles 26a are properly rearranged while pressing, thus the air gaps occurring as a result of the manufacturing defects of chassis base 24 can be decreased to a minimum.

Accordingly, the adhesion rate of thermally conductive medium 26 to chassis base 24 is improved, heat is conducted favorably from PDP 20 to the outside, and thereby the thermal conduction efficiency is improved.

In the case where the surface of PDP 20 is formed unevenly or protrusions exist thereon, heat is also conducted favorably through thermally conductive particles 26a like the case of chassis base 24, thus the thermal conduction efficiency can be further improved.

A thermally conductive medium according to a second embodiment of the present invention includes a plurality of thermally conductive particles formed in a multi-layered structure. It is preferable that each thermally conductive particle is formed in a two-layered structure having an inner and an outer layer.

Figure 5:
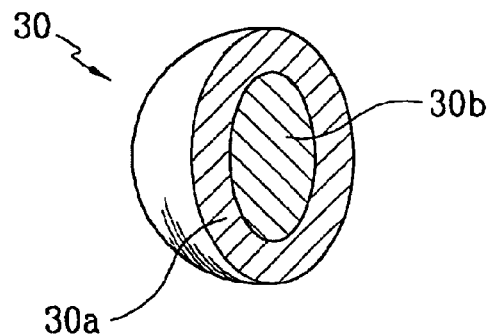
FIG. 5 is a perspective view, partially cut away, showing a thermal conduction particle according to a second embodiment of the present invention.
Figure 6:
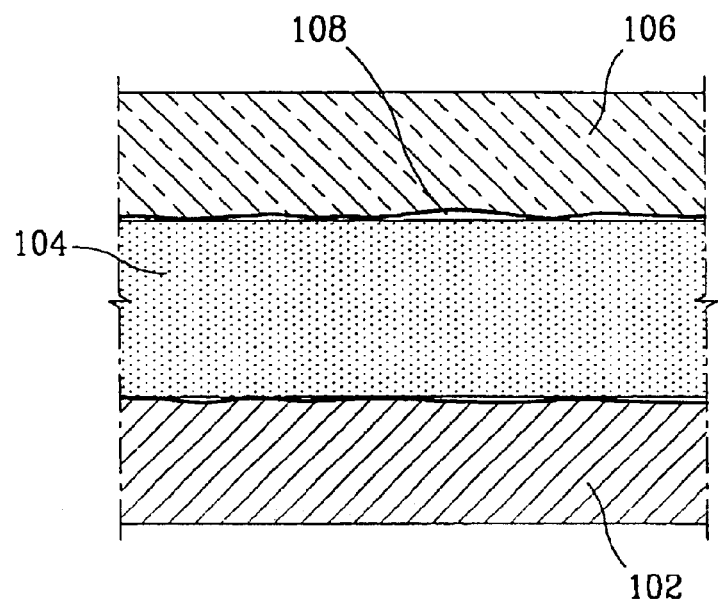
FIG. 6 is a fragmentary enlarged sectional view of plasma display device having means for thermal conduction according to a prior art.

FIG. 5 is a perspective view, partially cut away, showing a thermally conductive particle according to a second embodiment of the present invention.

An inner layer 30b of thermally conductive particle 30 is formed of a rubber material, and a outer layer 30a is formed of a silicone material, thereby both shock absorbability and thermal conductivity are improved. It is preferable that the thickness ratio of the outer layer to the inner layer be in the range of 1.5:1 to 2:1. Furthermore, inner layer 30b of thermally conductive particle 30 can be formed of other materials providing shock absorbability, not being restricted to the rubber material.

The thermally conductive particles 26a and 30 in accordance with the above embodiments of the present invention can be recycled when the plasma display device is no longer being used.

In the process of assembling the plasma display device according to the embodiments described in the above, the thermally conductive particles are arranged on one side of the chassis base where the adhesive pad is adhered, the PDP is placed thereon, and they are then pressed together. Alternatively, the thermally conductive particles are arranged on one side of the PDP where the adhesive pad is adhered, the chassis base is placed thereon, and they are then pressed together.

As described above, in the plasma display device according to the embodiments of the present invention, the adhesion rate of the thermally conductive medium can be improved without increasing the applied pressure, through employing a plurality of thermally conductive particles as a thermally conductive medium interposed between the PDP and the chassis base, while overcoming the manufacturing defects of the PDP and the chassis base. Accordingly, the heat generated at the PDP can be conducted favorably through the thermally conductive medium, so that the reliability of the end product can be enhanced by the improvement of the overall thermal conduction efficiency.

Since an additional member such as a cooling fan is not required for dissipating the heat generated at the PDP, a possible noise of the cooling fan may be avoided.

While the present invention has been described in detail with reference to certain embodiments, those skilled in the art will appreciate that various modifications and substitutions can be made thereto without departing from the spirit and scope of the present invention as set forth in the appended claims.

What is claimed is:

1. A plasma display device comprising:
   a plasma display panel;
   a chassis base disposed substantially parallel to the plasma display panel;
   a thermally conductive medium being disposed between the plasma display panel and the chassis base and being closely adhered to both the plasma display panel and the chassis base; and
   an adhesive pad being interposed between the plasma display panel and the chassis base along the edge of the thermally conductive medium, and being adhered to both the plasma display panel and the chassis base,
   wherein the thermally conductive medium includes a plurality of thermally conductive particles of high thermal conductivity,
   wherein the diameter of the thermally conductive particles is within 0.1–0.3 mm, and
   wherein a mixing ratio of a quantity of largest diameter thermally conductive particles to a quantity of smallest diameter thermally conductive particles would be in the range of 15:8 to 2:1.

2. A plasma display device comprising:
   a plasma display panel;
   a chassis base disposed substantially parallel to the plasma display panel;
   a thermally conductive medium being disposed between the plasma display panel and the chassis base and being closely adhered to both the plasma display panel and the chassis base; and
   an adhesive pad being interposed between the plasma display panel and the chassis base along the edge of the thermally conductive medium, and being adhered to both the plasma display panel and the chassis base,
   wherein the thermally conductive medium includes a plurality of thermally conductive particles of high thermal conductivity formed in a two-layered structure having an inner layer and an outer layer, and
   wherein the inner layer is formed of a rubber material and the outer layer is formed of a silicone material.

3. A plasma display device comprising:
   a plasma display panel;
   a chassis base disposed substantially parallel to the plasma display panel;
   a thermally conductive medium being disposed between the plasma display panel and the chassis base and being closely adhered to both the plasma display panel and the chassis base; and
   an adhesive pad being interposed between the plasma display panel and the chassis base along the edge of the thermally conductive medium, and being adhered to both the plasma display panel and the chassis base,
   wherein the thermally conductive medium includes a plurality of thermally conductive particles of high thermal conductivity formed in a two-layered structure having an inner layer and an outer layer, and
   wherein a thickness ratio of the outer layer to the inner layer is in the range of 1.5:1 to 2:1.

4. A thermally conductive medium for dissipating heat generated by a plasma display panel mounted to a chassis base and having a perimeter pad interposed between the plasma display panel and the chassis base forming a cavity therebetween, the thermally conductive medium comprising:
   a plurality of thermally conductive particles of high thermal conductivity layered within the cavity in rows pressed between the plasma display panel and the chassis base;
   wherein the thermally conductive particles have a diameter of 0.1–0.3 mm, and
   wherein a mixing ratio of a quantity of largest diameter thermally conductive particles to a quantity of smallest diameter thermally conductive particles would be in the range of 15:8 to 2:1.

5. A thermally conductive medium for dissipating heat generated by a plasma display panel mounted to a chassis base and having a perimeter pad interposed between the plasma display panel and the chassis base forming a cavity therebetween, the thermally conductive medium comprising:
   a plurality of thermally conductive particles of high thermal conductivity layered within the cavity in rows pressed between the plasma display panel and the chassis base;
   wherein the thermally conductive particles are formed in a two-layered structure having an inner layer and an outer layer, and
   wherein the inner layer is formed of a rubber material, and the outer layer is formed of a silicone material.

6. A thermally conductive medium for dissipating heat generated by a plasma display panel mounted to a chassis base and having a perimeter pad interposed between the plasma display panel and the chassis base forming a cavity therebetween, the thermally conductive medium comprising:

a plurality of thermally conductive particles of high thermal conductivity layered within the cavity in rows pressed between the plasma display panel and the chassis base;

wherein the thermally conductive particles are formed in a two-layered structure having an inner layer and an outer layer, and wherein a thickness ratio of the outer layer to the inner layer is in the range of 1.5:1 to 2:1.

7. A plasma display device comprising:

a plasma display panel;

a chassis base disposed substantially parallel to the plasma display panel;

a thermally conductive medium being disposed between the plasma display panel and the chassis base and being closely adhered to both the plasma display panel and the chassis base; and an adhesive pad being interposed between the plasma display panel and the chassis base along the edge of the thermally conductive medium, and being adhered to both the plasma display panel and the chassis base, wherein the thermally conductive medium is a plurality of thermally conductive particles of high thermal conductivity, wherein the diameter of the thermally conductive particles is within 0.1–0.3 mm, and wherein a mixing ratio of a quantity of largest diameter thermally conductive particles to a quantity of smallest diameter thermally conductive particles would be in the range of 15:8 to 2:1.

8. A plasma display device comprising:

a plasma display panel;

a chassis base disposed substantially parallel to the plasma display panel;

a thermally conductive medium being disposed between the plasma display panel and the chassis base and being closely adhered to both the plasma display panel and the chassis base; and an adhesive pad being interposed between the plasma display panel and the chassis base along the edge of the thermally conductive medium, and being adhered to both the plasma display panel and the chassis base, wherein the thermally conductive medium is a plurality of thermally conductive particles of high thermal conductivity, wherein the thermally conductive particles are multi-layered;

wherein the thermally conductive particles have an inner layer and an outer layer, and wherein the inner layer is formed of a rubber material and the outer layer is formed of a silicone material.

9. A plasma display device comprising:

a plasma display panel;

a chassis base disposed substantially parallel to the plasma display panel;

a thermally conductive medium being disposed between the plasma display panel and the chassis base and being closely adhered to both the plasma display panel and the chassis base; and an adhesive pad being interposed between the plasma display panel and the chassis base along the edge of the thermally conductive medium, and being adhered to both the plasma display panel and the chassis base, wherein the thermally conductive medium is a plurality of thermally conductive particles of high thermal conductivity, wherein the thermally conductive particles are multi-layered, wherein the thermally conductive particles have an inner layer and an outer layer, and wherein a thickness ratio of the outer layer to the inner layer is in the range of 1.5:1 to 2:1.

10. A thermally conductive medium for dissipating heat generated by a plasma display panel mounted to a chassis base and having a perimeter pad interposed between the plasma display panel and the chassis base forming a cavity therebetween, the thermally conductive medium comprising:

a plurality of thermally conductive particles of high thermal conductivity pressed between the plasma display panel and the chassis base, wherein the thermally conductive particles have a diameter of 0.1–0.3 mm, and wherein a mixing ratio of a quantity of largest diameter thermally conductive particles to a quantity of smallest diameter thermally conductive particles would be in the range of 15:8 to 2:1.

11. A thermally conductive medium for dissipating heat generated by a plasma display panel mounted to a chassis base and having a perimeter pad interposed between the plasma display panel and the chassis base forming a cavity therebetween, the thermally conductive medium comprising:

a plurality of thermally conductive particles of high thermal conductivity pressed between the plasma display panel and the chassis base, wherein the thermally conductive particles are multi-layered;

wherein the thermally conductive particles have an inner layer and an outer layer, and wherein the inner layer is formed of a rubber material and the outer layer is formed of a silicone material.

12. A thermally conductive medium for dissipating heat generated by a plasma display panel mounted to a chassis base and having a perimeter pad interposed between the plasma display panel and the chassis base forming a cavity therebetween, the thermally conductive medium comprising:

a plurality of thermally conductive particles of high thermal conductivity pressed between the plasma display panel and the chassis base, wherein the thermally conductive particles are multi-layered, wherein the thermally conductive particles have an inner layer and an outer layer, and wherein a thickness ratio of the outer layer to the inner layer is in the range of 1.5:1 to 2:1.

* * * * *